(12) United States Patent
Ozeki

(10) Patent No.: US 9,819,014 B2
(45) Date of Patent: Nov. 14, 2017

(54) FLEXIBLE SECONDARY BATTERY WITH POLYMER SOFTENING AGENT AND INTERNAL DEPRESSURIZATION

(71) Applicant: KONICA MINOLTA, INC., Chiyoda-ku, Tokyo (JP)

(72) Inventor: Hidekane Ozeki, Hachioji (JP)

(73) Assignee: KONICA MINOLTA, INC., Tokyo (JP)

(*) Notice: Subject to any disclaimer, the term of this patent is extended or adjusted under 35 U.S.C. 154(b) by 0 days.

(21) Appl. No.: 15/027,582

(22) PCT Filed: Oct. 7, 2014

(86) PCT No.: PCT/JP2014/076837
§ 371 (c)(1),
(2) Date: Apr. 6, 2016

(87) PCT Pub. No.: WO2015/053277
PCT Pub. Date: Apr. 16, 2015

(65) Prior Publication Data
US 2016/0248083 A1    Aug. 25, 2016

(30) Foreign Application Priority Data
Oct. 8, 2013    (JP) .................... 2013-210686

(51) Int. Cl.
*H01M 4/525*    (2010.01)
*H01M 4/36*    (2006.01)
(Continued)

(52) U.S. Cl.
CPC ............ *H01M 4/364* (2013.01); *H01B 1/125* (2013.01); *H01L 27/3225* (2013.01);
(Continued)

(58) Field of Classification Search
CPC .... H01M 4/364; H01M 2/0275; H01M 4/131; H01M 4/136; H01M 4/483; H01M 4/62;
(Continued)

(56) References Cited

U.S. PATENT DOCUMENTS

| 2010/0164888 A1* | 7/2010 | Okumura ............... G06F 1/1626 345/173 |
| 2012/0040211 A1* | 2/2012 | Murata ................ C03B 17/064 429/9 |

(Continued)

FOREIGN PATENT DOCUMENTS

| JP | H01204388 A | 8/1989 |
| JP | H10149880 A | 6/1998 |

(Continued)

OTHER PUBLICATIONS

Machine translation of Hashimoto, JP 2000-48860, provided by JPO.*

(Continued)

*Primary Examiner* — Peter Bradford
(74) *Attorney, Agent, or Firm* — Cantor Colburn LLP

(57) ABSTRACT

A flexible secondary battery having flexibility, wherein the flexible secondary battery is constituted by a lithium ion secondary battery, and contains one or more kind of softening agent(s) selected from acrylic-based polymers and diene-based polymers in an active substance layer of at least one of a positive electrode and a negative electrode, and the lithium ion secondary battery has an internal depressurization degree of from 10 to 1,000 Pa, is constituted.

15 Claims, 1 Drawing Sheet

(51) Int. Cl.

| | |
|---|---|
| *H01M 4/62* | (2006.01) |
| *H01B 1/12* | (2006.01) |
| *H01M 4/131* | (2010.01) |
| *H01M 4/136* | (2010.01) |
| *H01L 27/32* | (2006.01) |
| *H01L 51/52* | (2006.01) |
| *H01M 2/02* | (2006.01) |
| *H01M 4/48* | (2010.01) |
| *H01M 10/0525* | (2010.01) |
| *H01L 51/50* | (2006.01) |
| *H01M 10/42* | (2006.01) |
| *H01M 4/58* | (2010.01) |

(52) U.S. Cl.
CPC .......... *H01L 51/52* (2013.01); *H01M 2/0275* (2013.01); *H01M 4/131* (2013.01); *H01M 4/136* (2013.01); *H01M 4/483* (2013.01); *H01M 4/62* (2013.01); *H01M 10/0525* (2013.01); *H01L 51/50* (2013.01); *H01L 2251/5338* (2013.01); *H01M 4/525* (2013.01); *H01M 4/5825* (2013.01); *H01M 4/622* (2013.01); *H01M 10/4235* (2013.01); *H01M 2220/30* (2013.01)

(58) Field of Classification Search
CPC ............. H01M 10/0525; H01M 4/525; H01M 4/5825; H01M 4/622; H01M 10/4235; H01M 2220/30; H01L 27/3225; H01L 51/52; H01L 51/50; H01L 2251/5338; H01B 1/125
See application file for complete search history.

(56) References Cited

U.S. PATENT DOCUMENTS

| | | | | |
|---|---|---|---|---|
| 2013/0337304 | A1* | 12/2013 | Luski | H01M 2/021 |
| | | | | 429/94 |
| 2015/0125746 | A1* | 5/2015 | Sonobe | H01M 4/133 |
| | | | | 429/217 |
| 2015/0295277 | A1* | 10/2015 | Takahashi | H01M 4/62 |
| | | | | 429/336 |
| 2016/0156010 | A1* | 6/2016 | Chen | H01M 2/145 |
| | | | | 429/145 |

FOREIGN PATENT DOCUMENTS

| | | | |
|---|---|---|---|
| JP | 2000048860 | A * | 2/2000 |
| JP | 2001082058 | A | 3/2001 |
| JP | 2001273930 | A | 10/2001 |
| JP | 2003151556 | A | 5/2003 |
| JP | 2005056854 | A | 3/2005 |
| JP | 2010050026 | A | 3/2010 |
| JP | 2011023221 | A | 2/2011 |
| JP | 2013016444 | A | 1/2013 |
| JP | 2013062200 | A | 4/2013 |

OTHER PUBLICATIONS

International Search Report corresponding to Application No. PCT/JP2014/076837; dated Jan. 20, 2015, with English translation.
Written Opinion of the International Searching Authority corresponding to Application No. PCT/JP2014/076837; dated Jan. 20, 2015, with English translation.

* cited by examiner

10

20

30

FLEXIBLE SECONDARY BATTERY WITH POLYMER SOFTENING AGENT AND INTERNAL DEPRESSURIZATION

This is the U.S. national stage of application No. PCT/JP2014/076837, filed on Oct. 7, 2014. Priority under 35 U.S.C. §119(a) and 35 U.S.C. §365(b) is claimed from Japanese Application No. 2013-210686, filed Oct. 8, 2013, the disclosure of which is also incorporated herein by reference.

TECHNICAL FIELD

The present invention relates to a flexible secondary battery having flexibility, and various electronic devices including this flexible secondary battery such as image display devices (displays).

BACKGROUND ART

In image display devices (displays) using an organic electroluminescence device or the like as a light-emitting device, imparting of flexibility, and decreasing of use of cables in mobile-use are required.

In accordance with the imparting of flexibility and decreasing of use of cables in image display devices, imparting of flexibility to a power source part, which is a power supply, is also required.

Some constitutions in which an organic electroluminescence device and a secondary battery are combined have been suggested since before (for example, see Patent Literatures 1, 2 and 3).

CITATION LIST

Patent Literatures

Patent Literature 1: JP 1-204388 A
Patent Literature 2: JP 10-149880 A
Patent Literature 3: JP 2001-82058 A

SUMMARY OF INVENTION

Technical Problem

Currently, lithium ion secondary batteries, which are the mainstream of secondary batteries, have a significant problem in simultaneously achieving flexibility and a high capacity for imparting flexibility.

Conventional literatures such as Patent Literatures 1 to 3 do not describe any specific constitutions for imparting flexibility to batteries.

For example, the above-mentioned Patent Literature 3 describes that a sheet-like polymer secondary battery sealed by an outer packaging film is constituted by using a sheet-like positive electrode and a sheet-like negative electrode. However, Patent Literature 3 does not disclose how to constitute a sheet-like polymer secondary battery and to impart flexibility.

When one intends to impart flexibility to a lithium ion secondary battery, the capacity is generally decreased by a single digit or more.

The reason therefor is considered that, for example, if the amount of a binder (softening agent) in an active substance layer is increased so as to impart flexibility, then the ratio of the active substance that contributes to the battery function is decreased.

In order to solve the above-mentioned problem, the present invention provides a flexible secondary battery that can attain both flexibility and a high capacity. Furthermore, the present invention provides an electronic device including this flexible secondary battery.

Solution to Problem

The flexible secondary battery of the present invention is a flexible secondary battery having flexibility, and is constituted by a lithium ion secondary battery. This lithium ion secondary battery contains one or more kind of softening agent(s) selected from acrylic-based polymers and diene-based polymers in an active substance layer of at least one of a positive electrode and a negative electrode, and the lithium ion secondary battery has an internal depressurization degree of from 10 to 1,000 Pa.

Furthermore, the electronic device of the present invention includes the above-mentioned flexible secondary battery, and is driven by supplying an electrical power from the flexible secondary battery to the electronic device.

According to the above-mentioned flexible secondary battery of the present invention, by containing one or more kind of softening agent(s) selected from acrylic-based polymers and diene-based polymers in an active substance layer of at least one electrode of a positive electrode and a negative electrode, and by presetting the internal depressurization degree of the lithium ion secondary battery to from 10 to 1,000 Pa, flexibility can be imparted to the battery without affecting the capacity of the battery. Accordingly, the capacity is not decreased even the battery is formed into a thin-type constitution having flexibility, and thus a secondary battery having both flexibility and a high capacity can be attained.

Furthermore, according to the electronic device of the present invention, since the electronic device includes a flexible secondary battery having the above-mentioned constitution, and thus has a constitution such that the electronic device is driven by supplying an electrical power from the flexible secondary battery, the battery is of a thin-type and has flexibility. Therefore, the electronic device can be miniaturized, and the operation time of the electronic device can be extended.

Advantageous Effects of Invention

According to the above-mentioned flexible secondary battery of the present invention, a high capacity can be attained even the flexible secondary battery has a thin-type constitution having flexibility. Furthermore, according to the electronic device of the present invention, since the electronic device includes the above-mentioned flexible secondary battery, the battery is a thin-type, and has flexibility and a high capacity.

DESCRIPTION OF EMBODIMENTS

Figure 1:
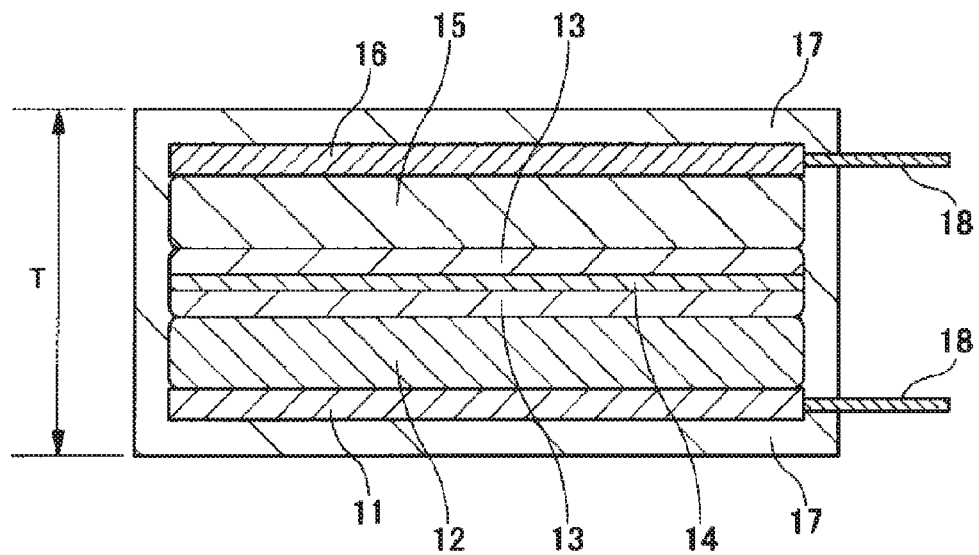
FIG. 1 is a schematic constitutional view (cross-sectional view) of a flexible secondary battery according to a first embodiment of the present invention.

The modes for carrying out the invention (hereinafter referred to as embodiments) will be explained below.

The explanations are made by the following order.
1. Summary of present invention
2. First embodiment (flexible secondary battery)
3. Second embodiment (electronic device)
4. Third embodiment (electronic device)

1. Summary of Present Invention

Firstly, the summary of the present invention will be explained prior to the explanations of the specific embodiments of the present invention.

A thin-type lithium ion secondary battery has a positive electrode current collector, a positive electrode active substance layer, an electrolyte and an electrolytic solution, a separator, an electrolyte and an electrolytic solution, a negative electrode active substance layer, and a negative electrode current collector, and is constituted by laminating these respective layers, and sealing the outer part with a sealant material.

The materials of the positive electrode active substance layer are mainly an active substance such as lithium oxide, a binder and additives.

In a conventional lithium ion secondary battery, PVDF (polyvinylidene fluoride) and the like are used for the binder of the positive electrode active substance layer, and acetylene black, which is a conductant agent, and the like are used as the additives.

As the material for the lithium oxide for the positive electrode active substance layer, $LiCoO_2$, $Li(Ni, Co, Mn)O_2$ and the like have been conventionally used as the mainstream.

The materials of the negative electrode active substance layer are mainly an active substance such as graphite, a binder and additives, and silicon is added as necessary.

In conventional lithium ion secondary batteries, SBR (styrene-butadiene rubber) and the like are used as a binder for a negative electrode active substance layer, and CMC (carboxymethyl cellulose), which is a thickener, and the like are used as additives.

When the binder in the positive electrode active substance layer or negative electrode active substance layer is increased, the flexibility is increased, whereas the ratio of the active substance is decreased. Therefore, the capacity of the lithium ion secondary battery is decreased.

In the flexible secondary battery of the present invention, both flexibility and a high capacity are attained by changing the constitutions listed below from those of a conventional secondary battery.

(1) Imparting a high capacity to a positive electrode.

In order to impart a high capacity to a positive electrode, an active substance containing one or more kind selected from $LiNi_ACo_BAl_CO_2$ (wherein A+B+C=1), $LiFePO_4$ and $MnO_2$ is used.

By using a positive electrode active substance containing the above-mentioned compound, the capacity of the positive electrode can be increased as compared to conventional positive electrode active substances (for example, $LiCoO_2$ and the like).

In $Li(Mn, Co, Ni)O_2$ and $LiMnO_2$, the theoretical capacity is about 150 mAh/g.

In response to this, when $LiNi_ACo_BAl_CO_2$ (wherein A+B+C=1), $LiFePO_4$, $MnO_2$ is/are used for the positive electrode active substance, the theoretical capacity is improved to about 250 to 400 mAh/g.

(2) The depressurization degree of the package is weakened.

In order to impart flexibility to a secondary battery, the packaging pressure during the sealing of the secondary battery should be weakened so that secondary battery can be bent.

The packaging pressure is preset to be about 30 to 50% of the packaging pressure for a conventional lithium ion secondary battery having no flexibility.

In the flexible secondary battery of the present invention, the package depressurization degree of the lithium ion secondary battery is preset to from 10 to 1,000 Pa. The package depressurization degree is preset to be preferably in the range of from 100 to 1,000 Pa, more preferably in the range of from 200 to 800 Pa, and the most preferably 500 Pa.

The criterion of the flexibility is such that a bending radius R is 100 mm or less, preferably the bending radius R is from 30 mm to 3 mm.

Furthermore, in the flexible secondary battery of the present invention, the thickness of the lithium ion secondary battery is preset to 1.5 mm or less, preferably to 0.5 mm or less.

(3) A binder (softening agent) is incorporated in the active substance layer. More preferably, the binder (softening agent) is improved, and an acrylic-based polymer or a diene-based polymer is used for the binder.

The binder (softening agent) is used in at least one of a positive electrode active substance layer and a negative electrode active substance layer.

More preferably, a softening agent formed of an acrylic-based polymer or a diene-based polymer is used as the binder. A copolymer of a softening agent of an acrylic-based polymer or a diene-based polymer and another binder material may also be formed. By using the acrylic-based polymer or diene-based polymer for the softening agent as the binder, the flexibility can be improved more than in the cases when other binder materials are used.

Examples of the specific materials for forming the acrylic-based polymer and the diene-based polymer include butadiene, PTFE (polytetrafluoroethylene), VDF (vinylidene fluoride), TFE (tetrafluoroethylene) and the like.

As the binder, for example, TRD1002 manufactured by JSR can be used.

In addition, in view of a problem of high flexibility, a diene-based polymer (SBR-based copolymer-containing compounds and the like) is preferable.

The constitutions of the flexible secondary battery other than the constitutions listed in (1) to (3) can be similar constitutions to those of conventionally-known thin-type lithium ion secondary batteries.

However, supposing that a secondary battery is used by bending in constituting a secondary battery having flexibility, it is desirable to use, for an electrolyte layer, a material that does not cause the leaking of an electrolyte solution and does not cause the breaking of the electrolyte layer by the bending of the secondary battery.

The electronic device of the present invention has a constitution that includes the flexible secondary battery of the present invention, wherein the electronic device is driven by supplying an electrical power from the flexible secondary battery.

Since the flexible secondary battery of the present invention is a thin-type and has flexibility, it is possible to miniaturize an arbitrary electronic device without occupying a large place by disposing the flexible secondary battery as a driving power source in the electronic device. Furthermore, since the flexible secondary battery can be used in a bent state, it is possible to increase the degree of freeness of the designing of the electronic device in which the flexible secondary battery is used.

Furthermore, since the flexible secondary battery of the present invention has a high capacity by changing the constitution of the lithium ion secondary battery from a conventional constitution, it is preferable in the cases when an electronic device equipped with the flexible secondary battery is used out of doors with no power source, and the like. For example, it is possible to use the flexible secondary battery of the present invention in various so-called mobile devices.

According to the electronic device of the present invention, the electronic device can be miniaturized, and the operation time of the electronic device can be extended by having the flexible secondary battery of the present invention.

In the case when the electronic device of the present invention is applied to, for example, an IC card, the IC card is constituted by connecting an antenna and a driving circuit with the flexible secondary battery.

It becomes possible by the flexible secondary battery to mount a battery having a high capacity onto an IC card without increasing the thickness of the IC card.

By this way, it is possible to attain an IC card that is thin and has various functions.

In the case when the electronic device of the present invention is applied to, for example, a thin-type display, it becomes possible to constitute the entirety of the display including a power source part to be thin by combining a thin-type image display part and a thin-type flexible secondary battery. Examples of the thin-type display to which the electronic device is applied can include liquid crystal displays and displays using an organic electroluminescence device.

Specifically, in an organic electroluminescence device (OLED), a constitution having flexibility in which a transparent flexible film is used in a substrate has been suggested, and it is possible to attain a flexible display by using a display using this organic electroluminescence device having flexibility and the flexible secondary battery of the present invention.

Furthermore, a constitution in which an organic electroluminescence device (OLED) is used in an illumination device as a light-emitting device has been suggested, and it is also possible to apply the electronic device of the present invention to this illumination device.

Specifically, it becomes possible to attain an illumination device having flexibility as a whole, by using an organic electroluminescence device (OLED) of a constitution having flexibility using a transparent flexible film as a substrate as a light-emitting body of the illumination device, and connecting the organic electroluminescence device with the flexible secondary battery of the present invention.

In the case when the electronic device of the present invention is applied to a device using an organic electroluminescence device (OLED), specific examples of the preferable layer constitution of the organic electroluminescence device used are shown below.

(i) Substrate film/anode/hole injection layer/hole transport layer/luminescent layer/electron transport layer/cathode (ii) Substrate film/anode/hole injection layer/hole transport layer/luminescent layer/electron transport layer/electron injection layer/cathode (iii) Substrate film/anode/hole injection layer/hole transport layer/luminescent layer/electron transport layer/hole blocking layer/cathode (iv) Substrate film/anode/hole injection layer/hole transport layer/luminescent layer/electron transport layer/electron injection layer/hole blocking layer/cathode (v) Substrate film/anode/hole injection layer/hole transport layer/electron blocking layer/luminescent layer/electron transport layer/electron injection layer/hole blocking layer/cathode As the substrate film, a resin film having flexibility is used.

As the material for each layer of each layer constitution, a conventionally-known material can be used.

It is preferable to form a protective film on the cathode of each layer constitution.

Furthermore, it is preferable to form a gas barrier film on the inner sides of the substrate film and the protective film.

In the case when the electronic device of the present invention is applied to an illumination device using an organic electroluminescence device (OLED) as a light-emitting device, it is possible to dispose the flexible secondary battery on one surface of the light-emitting device.

In preparing an illumination device having this constitution, for example, the light-emitting device and the flexible secondary battery are joined by bonding, or the light-emitting device and the flexible secondary battery are integrated by lamination.

Furthermore, as the electronic device of the present invention, it is possible to form a constitution in which the flexible secondary battery of the present invention and a sheet of an electronic material that serves as a power source by being irradiated with light such as a solar battery sheet are combined.

In the case of such constitution, it is possible to accumulate an electric energy generated by the irradiation with light in the flexible secondary battery.

Furthermore, as the method for supplying electrical power to the flexible secondary battery of the present invention, wireless power supply such as an electromagnetic induction type, an electric field-magnetic field resonance type and an electric wave receiver type can also be used. In the case when wireless power supply to the flexible secondary battery is conducted in an electronic device, a constitution for power supply to be connected to the flexible secondary battery may be disposed.

2. First Embodiment

The schematic constitutional view (cross-sectional view) of the flexible secondary battery of the first embodiment of the present invention is shown in FIG. 1.

The flexible secondary battery 10 shown in FIG. 1 is constituted by laminating respective layers of a positive electrode current collector 11, a positive electrode active substance layer 12, an electrolyte layer 13, a separator 14, an electrolyte layer 13, a negative electrode active substance layer 15 and a negative electrode current collector 16, and sealing the surrounding with a sealant material 17. Ejection tags (electrode terminals) 18 are connected to the positive electrode current collector 11 and the negative electrode current collector 16, and the ejection tags (electrode terminals) 18 are formed so as to extend to the outside of the sealant material 17.

For the positive electrode current collector 11, conventionally-known materials for positive electrode current collectors such as Al can be used.

For the positive electrode active substance layer 12, a positive electrode active substance containing one or more kind selected from $LiNi_ACo_BAl_CO_2$ (wherein A+B+C=1), $LiFePO_4$ and $MnO_2$, a binder and additives, and the like are used. As the additives for the positive electrode active substance layer 12, for example, acetylene black, which is a conductant agent, and the like can be used.

For the electrolyte layer 13, electrolytes such as $LiPF_6$ can be used.

For the separator 14, for example, polyolefins such as polypropylene and polyethylene can be used.

For the negative electrode active substance layer 15, conventionally-known materials for negative electrode active substances such as graphite, a binder and additives and the like are used. As the additives for the negative electrode active substance layer 15, for example, carboxymethyl cellulose (CMC), which is a thickener, can be used.

For the negative electrode current collector 16, conventionally-known materials for negative electrode current collectors such as Cu can be used.

For the sealant material 17, conventionally-known materials for sealant materials such as multilayer Al and PET (polyethylene telephthalate) films can be used.

As the positive electrode active substance for the positive electrode active substance layer 12, besides $LiNi_ACo_BAl_CO_2$ (wherein A+B+C=1), $LiFePO_4$ and $MnO_2$, for example, Mn-containing compounds such as $Li(Mn, Co, Ni)O_2$, $LiMnO_2$, $Li(Li, Mn)_{1-x}Co_xO_2$ and $Li_2MnO_3$ can also be used. Specifically, it is preferable to use lithium-excess Mn-containing oxides such as $Li(Mn, Co, Ni)O_2$ and $LiMnO_2$ as the Mn-containing compounds.

The internal package depressurization degree of the sealant material 17 is set to 10 to 1,000 Pa. preferably, the package depressurization degree is set to preferably in the range of from 100 to 1,000 Pa, more preferably in the range of from 200 to 800 Pa, the most preferably 500 Pa.

The thickness T of the flexible secondary battery 10 including the sealant material 17 is set to 1.5 mm or less, preferably 0.5 mm or less.

The softening agent using an acrylic-based polymer or a diene-based polymer is incorporated in at least one of the positive electrode active substance layer 12 and the negative electrode active substance layer 15. The softening agent may be a copolymer of the softening agent of acrylic-based polymers or diene-based polymers and other binder material.

Since the flexible secondary battery 10 of the present embodiment contains one or more kind selected from $LiNi_ACo_BAl_CO_2$ (wherein A+B+C=1), $LiFePO_4$ and $MnO_2$ in the positive electrode active substance of the positive electrode active substance layer 12, the sealant material 17 has an internal package depressurization degree of from 10 to 1,000 Pa, and the positive electrode active substance layer 12 and the negative electrode active substance layer 15 contains one or more kind of softening agent(s) selected from acrylic-based polymers and diene-based polymers, the flexible secondary battery 10 has a high capacity and sufficient flexibility.

3. Second Embodiment

Figure 2:
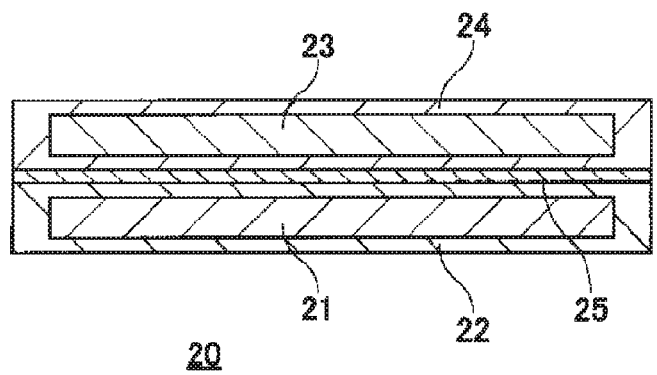
FIG. 2 is a schematic constitutional view (cross-sectional view) of an electronic device according to a second embodiment of the present invention.

The schematic constitutional view (cross-sectional view) of the electronic device of the second embodiment of the present invention is shown in FIG. 2.

This embodiment is such that the electronic device of the present invention is applied to a light-emitting sheet formed of an organic electroluminescence device (OLED).

The light-emitting sheet 20 shown in FIG. 2 is constituted such that a flexible secondary battery 21 is sealed by a sealant material 22, an OLED light-emitting device 23 is sealed by a sealant material 24, and the sealant material 22 and the sealant material 24 are attached by an adhesive layer 25.

Furthermore, the constitution is such that the OLED light-emitting device 23 is disposed on the upper side of the flexible secondary battery 21, and light is emitted from the upper surface of the OLED light-emitting device 23.

The flexible secondary battery 21 can be constituted by the flexible secondary battery of the present invention, and for example, can have a laminate structure that is similar to the laminate structure from the positive electrode current collector 11 of the flexible secondary battery 10 to the negative electrode current collector 16 in the first embodiment mentioned above.

The OLED light-emitting device 23 can be constituted by a light-emitting device formed of a sheet-like organic electroluminescence device (OLED) having flexibility, which has been suggested since before.

For the sealant material 22 and the sealant material 24, conventionally-used materials for sealing having flexibility can be used. Furthermore, the sealant materials themselves may contain a material having gas barrier property, or may form a film having gas barrier property inside of the sealant materials.

The flexible secondary battery 21 and the OLED light-emitting device 23 are electrically connected, although the connection is not illustrated.

Furthermore, where necessary, for example, a step-up circuit for the pressure rising of an electromotive power of the flexible secondary battery 21 and supplying the electromotive power to the OLED light-emitting device 23 can be disposed outside of the light-emitting sheet 20.

It is also possible to dispose the step-up circuit inside of the light-emitting sheet 20 as long as the step-up circuit can be constituted by a flexible substrate and a thin film circuit.

Since the light-emitting sheet 20 of this embodiment is such that the sealant materials 22 and 24, which respectively seal the flexible secondary battery 21 and the OLED light-emitting device 23, are attached, and the flexible secondary battery 21 and the OLED light-emitting device 23 are electrically connected, light can be emitted by driving the OLED light-emitting device 23 by the flexible secondary battery 21.

Furthermore, since either of the flexible secondary battery 21 and the OLED light-emitting device 23 is sheet-like and thus has flexibility, the light-emitting sheet 20 having flexibility can be attained. Furthermore, it is also possible to emit light even in a state in which the light-emitting sheet 20 is bent.

4. Third Embodiment (Electronic Device)

Figure 3:
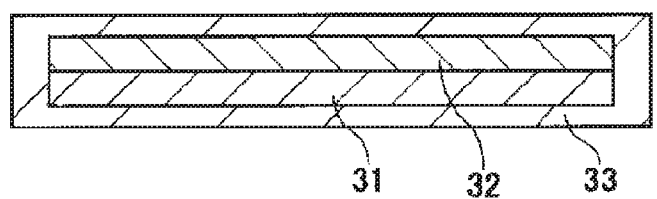
FIG. 3 is a schematic constitutional view (cross-sectional view) of an electronic device according to a third embodiment of the present invention.

The schematic constitutional view (cross-sectional view) of the electronic device of the third embodiment of the present invention is shown in FIG. 3.

Also in this embodiment, the electronic device of the present invention is applied to a light-emitting sheet formed of an organic electroluminescence device (OLED).

The light-emitting sheet 30 shown in FIG. 3 is constituted by laminating an OLED light-emitting device 32 on a flexible secondary battery 31, and sealing the entirety by a sealant material 33.

Furthermore, the constitution is such that the OLED light-emitting device 32 is disposed on the upper side of the flexible secondary battery 31, and light is emitted from the upper surface of the OLED light-emitting device 32.

The flexible secondary battery 31 can be constituted by the flexible secondary battery of the present invention, and for example, can have a laminate structure that is similar to the laminate structure of the flexible secondary battery 10 of the first embodiment mentioned above from the positive electrode current collector 11 to the negative electrode current collector 16.

The OLED light-emitting device 32 can be constituted by a light-emitting device formed of a sheet-like organic electroluminescence device (OLED) having flexibility which has been suggested since before.

As the sealant material 33, a conventionally-known sealing material having flexibility can be used. Furthermore, the sealant material itself may contain a material having gas barrier property, or a film having gas barrier property may be formed on the inner side of the sealant material.

The flexible secondary battery 31 and the OLED light-emitting device 32 are electrically connected, although the connection is not illustrated.

Since the light-emitting sheet 30 of this embodiment is such that the flexible secondary battery 31 and the OLED light-emitting device 32 are laminated, and the flexible secondary battery 31 and the OLED light-emitting device 32 are electrically connected, light can be emitted by driving the OLED light-emitting device 32 by the flexible secondary battery 31.

Furthermore, since either of the flexible secondary battery 31 and the OLED light-emitting device 32 is sheet-like and has flexibility, the light-emitting sheet 30 having flexibility can be attained. In addition, light can be emitted even in a state in which the light-emitting sheet 30 is bent.

The present invention is not limited to the above-mentioned embodiments, and may have various constitutions within a scope that does not deviate from the gist of the present invention.

REFERENCE SIGNS LIST 10, 21, 31 . . . flexible secondary batteries,
11 . . . positive electrode current collector,
12 . . . positive electrode active substance layer,
13 . . . electrolyte layer,
14 . . . separator,
15 . . . negative electrode active substance layer,
16 . . . negative electrode current collector,
17, 22, 24, 33 . . . sealant materials,
18 . . . ejection tag (electrode terminal),
20, 30 . . . light-emitting sheets,
23, 32 . . . OLED light-emitting devices

The invention claimed is:

1. A flexible secondary battery having flexibility, wherein the flexible secondary battery is constituted by a lithium ion secondary battery, and contains one or more kind of softening agent(s) selected from acrylic-based polymers and diene-based polymers in an active substance layer of at least one of a positive electrode and a negative electrode, and
the lithium ion secondary battery has an internal depressurization degree of from 200 to 800 Pa.

2. The flexible secondary battery according to claim 1, wherein the lithium ion secondary battery has a thickness of 1.5 mm or less.

3. The flexible secondary battery according to claim 2, wherein the active substance of the positive electrode is one or more kind selected from $LiNi_A Co_B Al_C O_2$ (wherein A+B+C=1), $LiFePO_4$ and $MnO_2$.

4. The flexible secondary battery according to claim 1, wherein the active substance of the positive electrode is one or more kind selected from $LiNi_A Co_B Al_C O_2$ (wherein A+B+C=1), $LiFePO_4$ and $MnO_2$.

5. The flexible secondary battery according to claim 4, wherein the active substance of the positive electrode is one or more kind selected from LiNiACoBAlCO2 (wherein A+B+C=1) and MnO2.

6. The flexible secondary battery according to claim 4, wherein the active substance of the positive electrode is one or more kind selected from LiNiACoBAlCO2 (wherein A+B+C=1).

7. The flexible secondary battery according to claim 1, wherein the softening agent contains the diene-based polymer, wherein the diene-based polymer contains a styrene-butadiene rubber-based material.

8. The flexible secondary battery according to claim 1, wherein a bending radius R of the flexible secondary battery is 100 mm or less.

9. The flexible secondary battery according to claim 1, wherein a bending radius R of the flexible secondary battery is from 30 mm to 3 mm.

10. An electronic device, comprising
a flexible secondary battery having flexibility, wherein the flexible secondary battery is constituted by a lithium ion secondary battery, and contains one or more kind of softening agent(s) selected from acrylic-based polymers and diene-based polymers in an active substance layer of at least one of a positive electrode and a negative electrode, and the lithium ion secondary battery has an internal depressurization degree of from 200 to 800 Pa, and
the electronic device is driven by supplying an electrical power from the flexible secondary battery to the electronic device.

11. The electronic device according to claim 10, comprising a light-emitting device composed of an organic electroluminescence device.

12. The electronic device according to claim 11, wherein the light-emitting device and the flexible secondary battery are joined by bonding.

13. The electronic device according to claim 11, wherein the light-emitting device and the flexible secondary battery are integrated by lamination.

14. The electronic device according to claim 10, wherein the active substance of the positive electrode is one or more kind selected from LiNiACoBAlCO2 (wherein A+B+C=1) and MnO2.

15. The electronic device according to claim 10, wherein the active substance of the positive electrode is one or more kind selected from LiNiACoBAlCO2 (wherein A+B+C=1).

* * * * *